United States Patent
Hong et al.

[19]

[11] Patent Number: 6,128,074
[45] Date of Patent: Oct. 3, 2000

[54] METHOD AND APPARATUS FOR INSPECTION OF PIN GRID ARRAY PACKAGES FOR BENT LEADS

[75] Inventors: Yee Peng Hong; Ng Ah Soon; Tan Kia Wai, all of Singapore, Singapore

[73] Assignee: Advanced Micro Devices, Inc., Sunnyvale, Calif.

[21] Appl. No.: 08/883,324

[22] Filed: Jun. 26, 1997

[51] Int. Cl.[7] .................................................. G01N 21/00
[52] U.S. Cl. ......................... 356/237.1; 356/399; 29/741
[58] Field of Search ................................ 356/394, 237.1, 356/398, 375, 399; 29/741, 703, 710; 140/147; 324/158.1, 765, 537

[56] References Cited

U.S. PATENT DOCUMENTS

| | | | |
|---|---|---|---|
| 4,549,087 | 10/1985 | Duncen et al. | 250/561 |
| 4,691,747 | 9/1987 | Sokolovsky | 140/147 |
| 4,728,195 | 3/1988 | Silver | 356/394 |
| 5,278,634 | 1/1994 | Skunes et al. | 356/400 |
| 5,509,192 | 4/1996 | Ota et al. | 29/741 |
| 5,591,036 | 1/1997 | Doi et al. | 439/79 |

FOREIGN PATENT DOCUMENTS

| | | |
|---|---|---|
| 4-025044 | 1/1992 | Japan . |
| 4-223353 | 8/1992 | Japan . |
| 4-223354 | 8/1992 | Japan . |
| 2183820 | 6/1987 | United Kingdom . |

OTHER PUBLICATIONS

"Component Placement Verification through Height Discontinuities," *IBM Technical Disclosure Bulletin*, vol. 29, No. 5, Oct. 1986, New York, pp. 2216–2223.

*Primary Examiner*—Hoa Q. Pham
*Attorney, Agent, or Firm*—Fliesler, Dubb, Meyer & Lovejoy

[57] ABSTRACT

A pin grid array inspection device includes an inspection gauge having a rectangular matrix of holes corresponding to leads of a pin grid array. In the preferred embodiment, a retractable device holder extends through a central opening in the inspection gauge. The device holder contacts the central leadless section of the pin grid array and provides a resting place for the pin grid array before an alignment mechanism grasps the pin grid array. An alignment mechanism positioned above the inspection gauge guides the pin grid array and aligns it to the inspection gauge. The device holder retracts, and the pin grid array descends into the inspection gauge due to gravity. An optical scanning receiver is mounted opposite of an optical scanning transmitter to receive an optical inspection beam. The optical scanning transmitter shines an optical inspection beam over the pin grid array as it rests in the inspection gauge. A bent lead will cause friction with its corresponding hole in the inspection gauge causing the pin grid array to remain at least partially raised above the inspection gauge. If the pin grid array does not lie flatly in the inspection gauge, and is therefore at least partially raised above the inspection, it blocks optical inspection beam, and an output circuit signals the automated operator that the pin grid array has at least one bent lead. If the pin grid array lies flatly in the inspection gauge, the pin grid array does not have any bent leads. The device holder also extends after the test to insure that the pin grid array is vertically elevated above the inspection gauge regardless of the test results.

8 Claims, 7 Drawing Sheets

METHOD AND APPARATUS FOR INSPECTION OF PIN GRID ARRAY PACKAGES FOR BENT LEADS

BACKGROUND OF THE INVENTION

1. Field of the Invention

The present invention is related to quality assurance inspection of Pin Grid Array semiconductor packages, and specifically, to the detection of bent leads on a Pin Grid Array semiconductor package. The present invention improves overall inspection productivity by automating a conventionally manual process.

2. Discussion of the Related Art

In the manufacturing of integrated circuits, the semiconductor dies are placed inside packages. The package protects the die from damage, provides a thermally conductive path away from the die in order to dissipate heat, and provides electrical connectivity to other circuit elements. The electrical connections of the package are called leads. In a pin grid array, the leads are metal extensions (pins) which protrude downward from the underside of the package. The leads placed at points along a rectangular matrix (grid). In order to integrate the pin grid array into a circuit board, the package is inserted into a mating connector having a rectangular matrix of holes for receiving the leads of the pin grid array. The mating connector is either mounted on the circuit board or is formed in the circuit board itself.

Pin grid array packages are usually chosen for integrated circuits having a very large number of leads. Integrated circuits having fewer inputs and outputs can be contained in packages having leads only along the peripheral edges of the package, without having connections underneath. The large number of leads in the pin grid array package can require a large insertion force when installing the pin grid array into the mating connector.

In order to properly install the pin grid array, all the leads must exactly match up with the corresponding holes in the mating connector. If a lead is very slightly bent, that lead will require a greater force to insert into the mating connector. In this case, the process of installation will unbend the lead. However, if the lead is more severely bent, that lead may not install properly at all, but rather will not make contact with its mating hole. Installation of the severely bent lead will bend the lead even further, perhaps breaking it off, and preventing the proper installation of the pin grid array into the circuit board. Therefore, the inspection of the leads for bends is a necessary part of the final inspection of pin grid array integrated circuits prior to shipment.

Conventionally, the inspection for bent leads of pin grid array packages has been performed manually. This manual inspection is tedious as the inspector must strain her eyes to search for bent leads. Additionally, the conventional process of manual inspection for bent leads is unreliable and inspector dependent, resulting in human error and inconsistency. False positives and false negatives occur more frequently for less experienced and less skilled inspectors. A false positive is the incorrect identification of a pin grid array as having a bent lead, when in reality the pin grid array was not flawed, and therefore did not have any bent leads. A false negative is the incorrect identification of a pin grid array as being good, and thus having no bent leads, when in fact the pin grid array was flawed, and did have bent leads. False positives during lead inspection unnecessarily reduce the yield of the manufacturing process while false negatives result in the shipment to customers of flawed products.

Moreover, the conventional manual inspection for bent leads of pin grid arrays is more time-consuming for larger, more complex pin grid arrays having more leads. The time required for conventional manual inspection for bent leads of pin grid arrays is roughly proportional to the number of leads. This variable inspection time creates additional complications in scheduling the correct number of inspectors for the inspection workload.

As is apparent from the above discussion, a need exist for an automated process of inspection for bent leads which is not prone to human error and which requires only a constant amount of time for pin grid arrays of all complexities.

SUMMARY OF THE INVENTION

Conventional manual inspection of pin grid arrays for bent leads is subject to human error and requires an inspection time dependent upon the number of leads on each pin grid array. An advantage of the present invention is the automation of the inspection of pin grid arrays for bent leads. The automation of the inspection eliminates most of the possibility of human errors, thereby increasing the accuracy and precision of the inspection. In addition, the automation of the inspection reduces the inspection time and provides a constant inspection time for pin grid arrays having any number of leads, so that the inspection time is not dependent upon the number of leads in the pin grid array package. Bent leads caused by human handling can be reduced, thereby increasing the robustness of the manufacturing process.

A pin grid array inspection device according to the present invention includes an inspection gauge having a rectangular matrix of holes corresponding to leads of a pin grid array. An alignment mechanism positioned above the inspection gauge grips the pin grid array and aligns it to the inspection gauge.

With the retractable device holder retracted, the pin grid array is allowed to descend by the force of gravity into the inspection gauge. In the preferred embodiment, two optical scanning receivers are mounted opposite of the optical scanning transmitters to receive the inspection beams. Both optical scanning transmitters shine the optical inspection beam over the pin grid array as it rests in the inspection gauge. A bent lead will cause friction with its corresponding hole in the inspection gauge causing the pin grid array to remain at least partially raised above the inspection gauge. If the pin grid array does not lie flatly in the inspection gauge, and is therefore at least partially raised above the inspection gauge, it blocks optical inspection beam, and an output circuit signals the operator that the pin grid array has at least one bent lead. If the pin grid array lies flatly in the inspection gauge, the pin grid array does not have any bent leads.

The transmitters are mounted 80 millimeters from the corresponding receivers and the inspection beams are 10 millimeters above the level of the mounting block. In the preferred embodiment, a retractable device holder extends through a central opening in the inspection gauge. The device holder contacts the central leadless section of the pin grid array and provides a resting place for the pin grid array before the alignment mechanism grasps the pin grid array. The device holder also extends after the test to insure that the pin grid array is vertically elevated above the inspection gauge regardless of the test results. In the preferred embodiment, a pair of precisors mounted on a pneumatic gripper are the alignment mechanism. Each precisor fits against a diagonally opposite corner of the pin grid array.

An overall increase in inspection productivity and decreased inspection error rate are achieved by using the pin grid array inspection device and corresponding inspection method. These and other features and advantages of the present invention are more fully described in the Detailed Description of the Invention read in conjunction with the Drawings.

BRIEF DESCRIPTION OF THE DRAWINGS

In FIGS. 1A through 7, like parts are identified with like numerals.

FIG. 1A is a plan view illustration of a pin grid array inspection device according to the present invention prior to placement of a pin grid array onto the inspection device.

FIG. 7 is a process flow chart illustrating the steps of the inspection method of the present invention.

The Figures are explained more fully in the Detailed Description of the Invention.

DETAILED DESCRIPTION OF THE INVENTION

According to the present invention, an automated inspection method uses a pin grid inspection device to inspect for bent leads of a pin grid array. The inspection time and the error rate are independent of the number of leads on a package. A pin grid array inspection device is used to segregate flawed pin grid arrays having bent leads from good pin grid arrays having no bent leads. Using the inspection device, a simple one-stop inspection process is performed for pin grid arrays of all complexities. An overall increase in inspection productivity and decreased inspection error rate are achieved by using the pin grid array inspection device and corresponding inspection method. Furthermore, the rate of occurrence of bent leads caused by human handling is reduced, thereby increasing the yield and robustness of the manufacturing process as a whole.

FIG. 1 illustrates the preferred embodiment of the pin grid array inspection device according to the present invention. The inspection device according to the present invention uses an inspection gauge 101 to identify bent leads. The inspection gauge 101 is a flat sheet of material having circular holes positioned in a rectangular matrix corresponding to the possible positions of leads in a pin grip array. The radius of the holes determines the maximum acceptable bend in each lead. The lead may be bent by an amount less than the radius of the hole minus the radius of the lead without causing the detection of a bent lead.

Figure 1A:
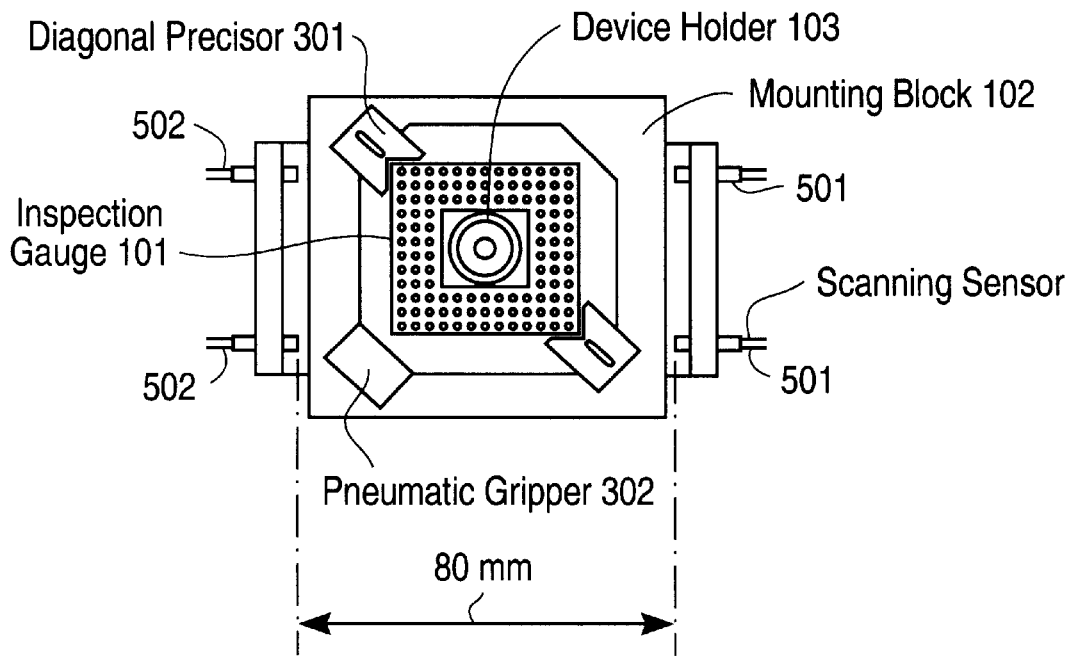

A standard pin grid array package has a flat rectangular area on the bottom center of the package where no leads are attached to the package. Surrounding the flat rectangular area are rows and columns of leads. In FIG. 1A, the inspection gauge 101 includes a central opening corresponding to the leadless flat rectangular area of the pin grid array. The inspection gauge 101 includes rows and columns of holes accommodating three rows or columns of leads surrounding the leadless flat rectangular area. The separation of the holes in the inspection gauge 101 is dictated by the standard pin grid array lead pitch.

Figure 1B:
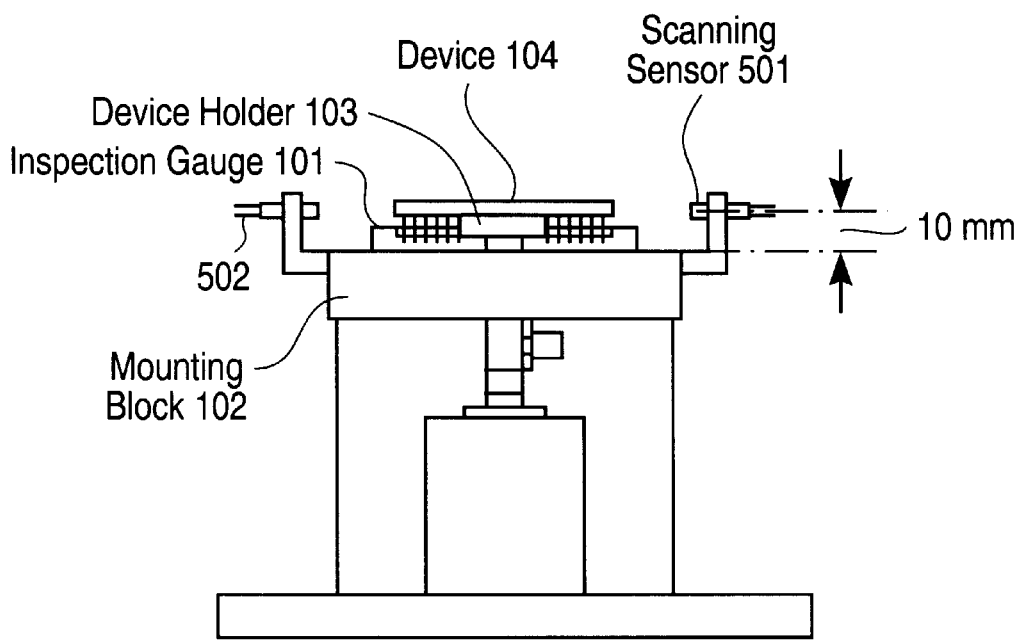
FIG. 1B is a front view illustration of a pin grid array inspection device according to the present invention having a pin grid array resting on its device holder at the beginning of the inspection method according to the present invention.

As illustrated in FIG. 1B, the inspection gauge 101 is supported by vertical supports and is mounted on a mounting block. The inspection gauge 101 is horizontally mounted so that it lies in a plane perpendicular to the force of gravity. Through the central opening of the inspection gauge 101 is a retractable device holder 103 which extends vertically through the inspection gauge. In the illustrations of FIG. 1B, the device holder 103 is illustrated as also extending through the mounting block 102; however, there is no requirement according to the present invention that the device holder 103 extend through the mounting block 102. For example, if the inspection gauge 101 were mounted higher above the mounting block 102 than is illustrated in FIG. 1B, the device holder 103 could be mounted on the same mounting block 102. The requirements according to the present invention are that the device holder 103 must support the pin grid array so that none of the leads reach the plane of the inspection gauge 101 when extended, and the device holder 103 must retract below the plane of the inspection gauge 101 when retracted. The device holder 103 includes an upper portion suitable for suspending the pin grid array above the inspection gauge 101 and in the same plane as the inspection gauge 101. In FIG. 1A, the upper portion is illustrated as being a circular flat surface, however there is no requirement that the surface be circular or flat. For example, three support points could stably support the pin grid array package parallel to the inspection gauge 101.

Figure 2A:
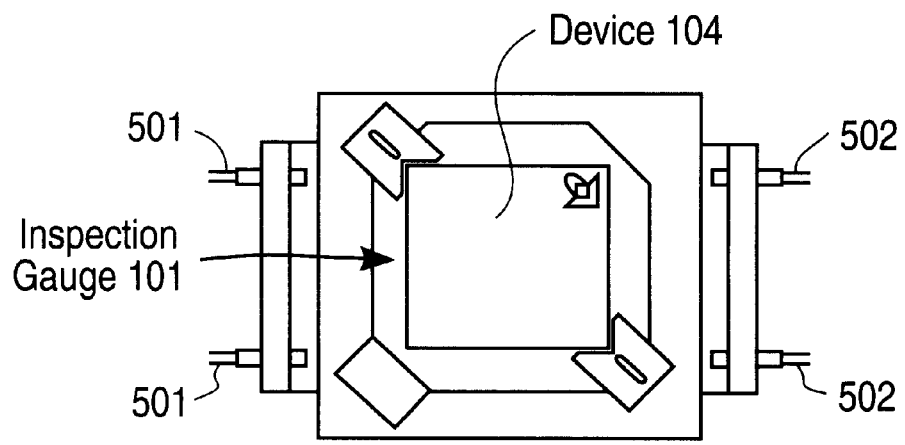
FIG. 2A is a plan view illustration of a pin grid array inspection device according to the present invention having a pin grid array resting on its device holder at the beginning of the inspection method according to the present invention.
Figure 2B:
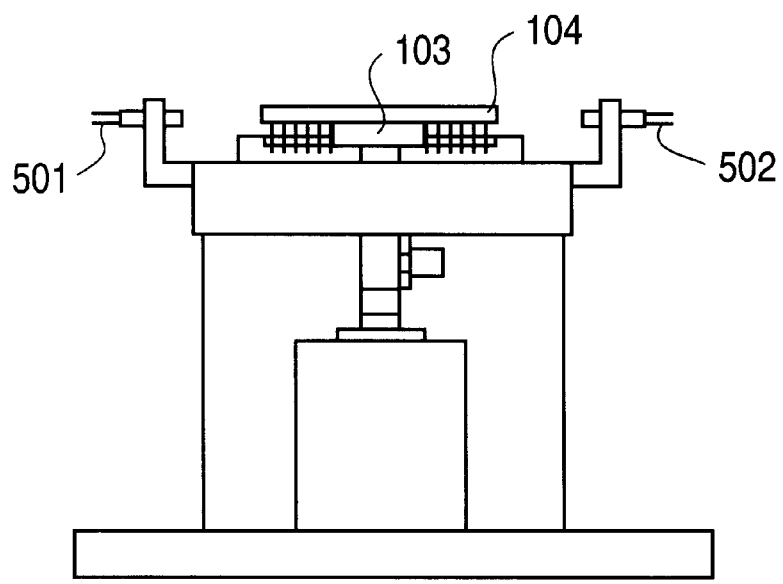
FIG. 2B is a front view illustration of a pin grid array inspection device according to the present invention having a pin grid array resting on its device holder at the beginning of the inspection method according to the present invention.

In the preferred embodiment, each pin grid array 104 being tested is first rested on a device holder 103 above the inspection gauge 101. FIG. 2A illustrates the pin grid array 104 after it has been placed on the device holder 103 by a human operator (not shown). The pin grid array 104 need not be precisely placed onto the device holder 103 because an alignment mechanism with diagonal precisors 301 will subsequently align the pin grid array 104 to the inspection gauge 101. The device holder 103 surface is large enough that the pin grid array 104 will remain balanced on the device holder 103 regardless of which portion of the central leadless area of the pin grid array 104 is contacted to the device holder 103. FIG. 2B illustrated the pin grid array 104 and device holder 103 prior to alignment by the alignment mechanism.

Figure 3A:
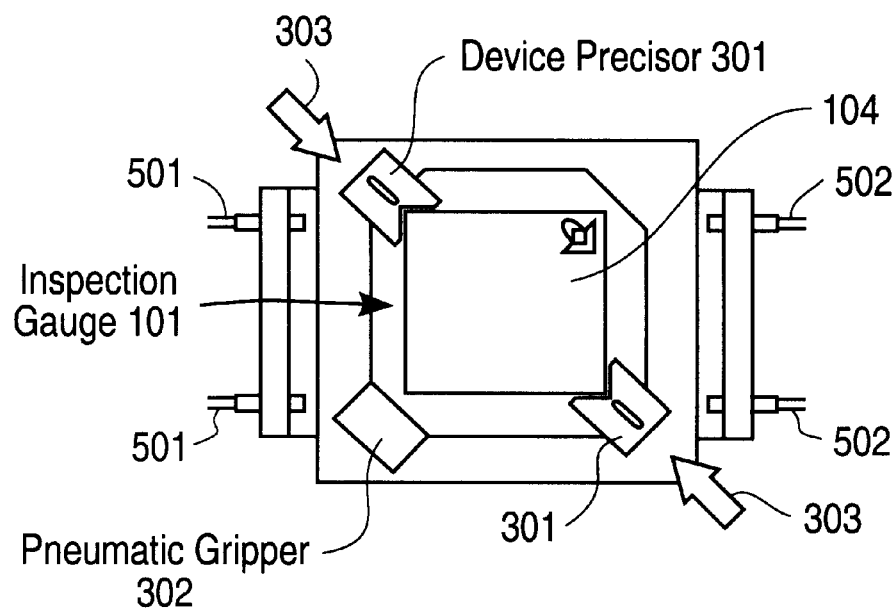
FIG. 3A is a plan view illustration of a pin grid array inspection device according to the present invention during the alignment of the pin grid array to the inspection gauge by the pair of diagonal precisors in the inspection method of the present invention.
Figure 3B:
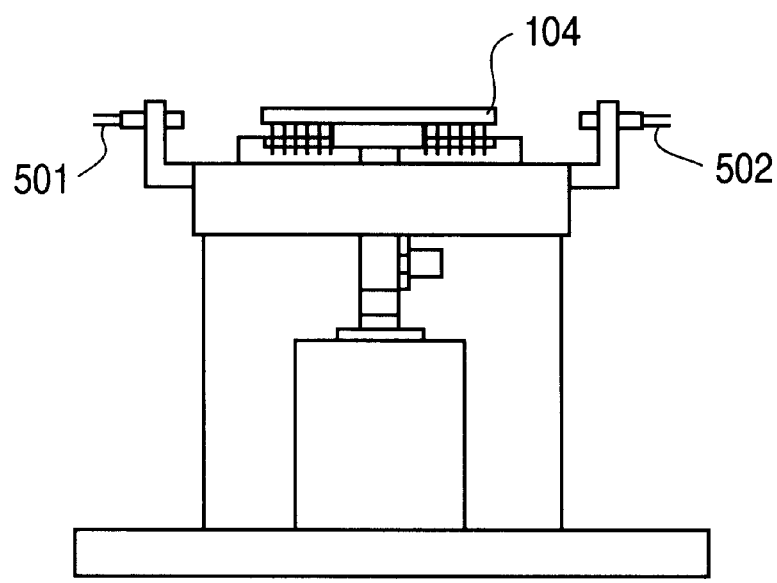
FIG. 3B is a front view illustration of a pin grid array inspection device according to the present invention after the alignment of the pin grid array to the inspection gauge in the inspection method of the present invention.

FIG. 3A illustrates the function of the alignment mechanism. In the preferred embodiment, the alignment mechanism is a pair of diagonal precisors 301. The diagonal precisors 301 are adjustable to package dimensions. The precisors 301 are mounted on a pneumatic gripper 302 in the preferred embodiment. The pneumatic gripper 302 actuates the diagonal precisors 301. The edges of the diagonal precisors are adjusted so that the leads of the pin grid array 104 are directly above the corresponding holes in the inspection gauge 101. The force arrows 303 illustrate the pressure applied by the diagonal precisors 301 to the pin grid array 104. FIG. 3B illustrates the pin grid array 104 after alignment.

Although in the preferred embodiment, the pneumatic gripper is actuated by air, the present invention is alternatively built using electric motors with gears, liquid movement mechanisms, or any other adequate means for gripping the pin grid array.

Figure 4A:
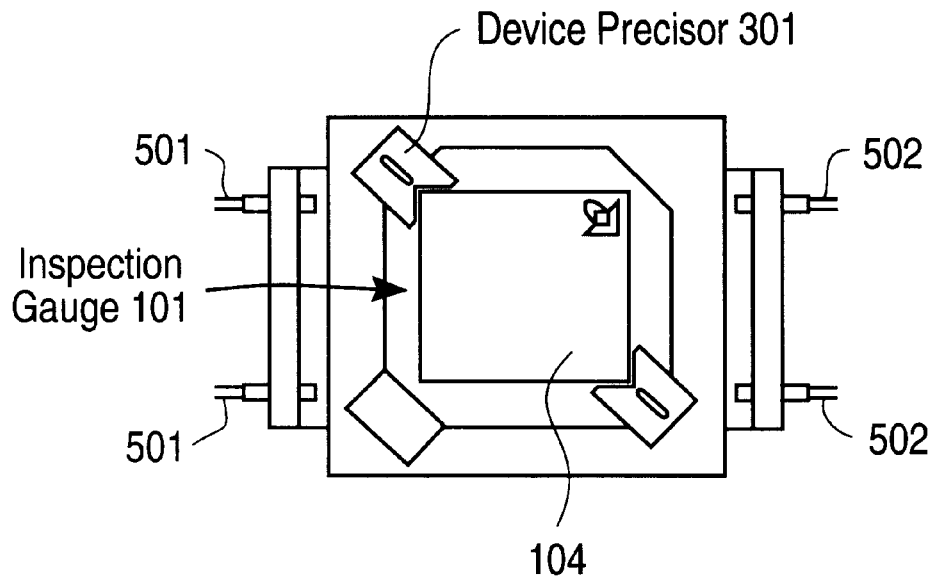
FIG. 4A is a plan view illustration of a pin grid array inspection device according to the present invention after the pin grid array is aligned to the inspection gauge by the pair of diagonal precisors in the inspection method of the present invention.
Figure 4B:
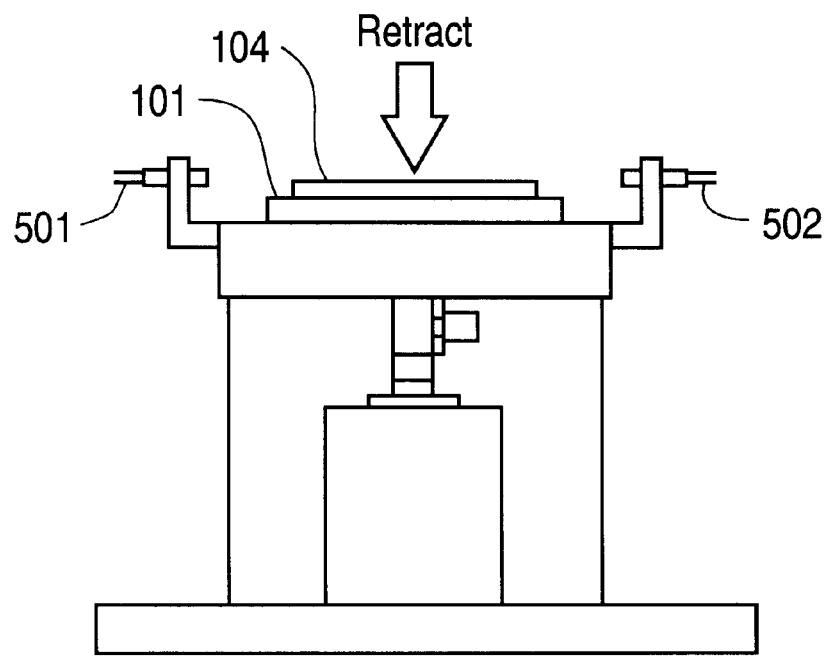
FIG. 4B is a front view illustration of a pin grid array inspection device according to the present invention after the pin grid array has fallen into the inspection gauge after the retractable device holder has retracted in the inspection method of the present invention.

FIG. 4A illustrates the pin grid array 104 after it has dropped into the inspection gauge 101. FIG. 4B illustrates the pin grid array 104 after the device holder 104 has been retracted. The pin grid array 104 rests flatly on the inspection gauge, indicating that there are no bent leads on the pin grid array 104. The leads of the pin grid array are fully inserted into the corresponding holes of the inspection gauge 101, thereby allowing the pin grid array to rest flatly. If any of the leads had been bent by more than the hole radius, friction between that bent lead and its corresponding hole would have prevented the pin grid array 104 from sitting down completely into the inspection gauge 101.

Figure 5A:
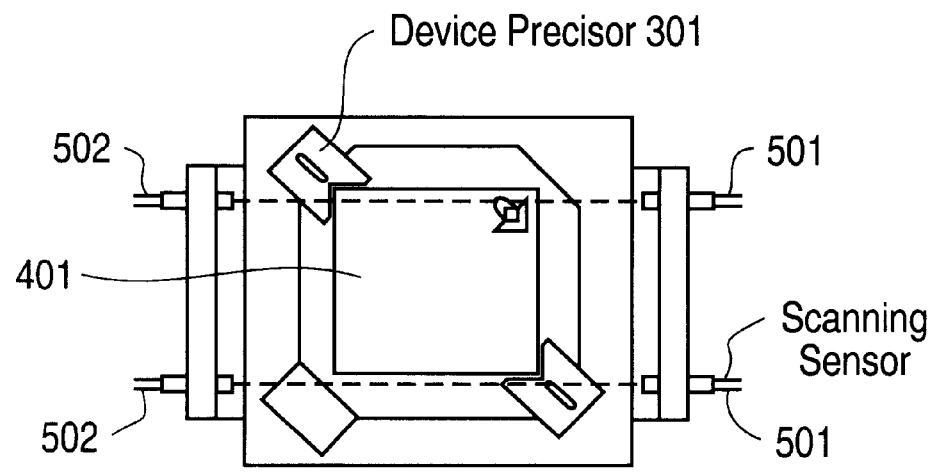
FIG. 5A is a plan view illustration of a pin grid array inspection device according to the present invention during checking for a raised package or flatly resting package by optically scanning above the package in the inspection method of the present invention.

FIG. 5A illustrates the pin grid array 104 as it is being checked for bent leads. Two optical scanning transmitters 502 each emit a concentrated optical inspection beam directed at a corresponding optical scanning receiver 501. The optical scanning transmitters 502 are preferably implemented as fiber optic devices. As illustrated by the dotted lines in FIG. 5B, the optical inspection beam passes just above the pin grid array 104. If the pin grid array 104 has a bent lead, it will not sit flatly on the inspection gauge 101. One or both of the optical inspection beams will be blocked by the pin grid array 104 if it has any bent leads. The optical scanning transmitters 502 are mounted 80 millimeters away from their corresponding optical scanning receivers 501 in the preferred embodiment. This separation allows adequate room for handling packages between the transmitters 502 and receivers 501. In the preferred embodiment, the optical inspection beams run 10 millimeters above the mounting block 102. The elevation of the inspection beams above the surface of the inspection gauge is an important relation. The inspection beams must be high enough above the package so that flatly lying packages do not block the beams, but low enough so that any substantial elevation of the packages will block the beams.

Figure 6A:
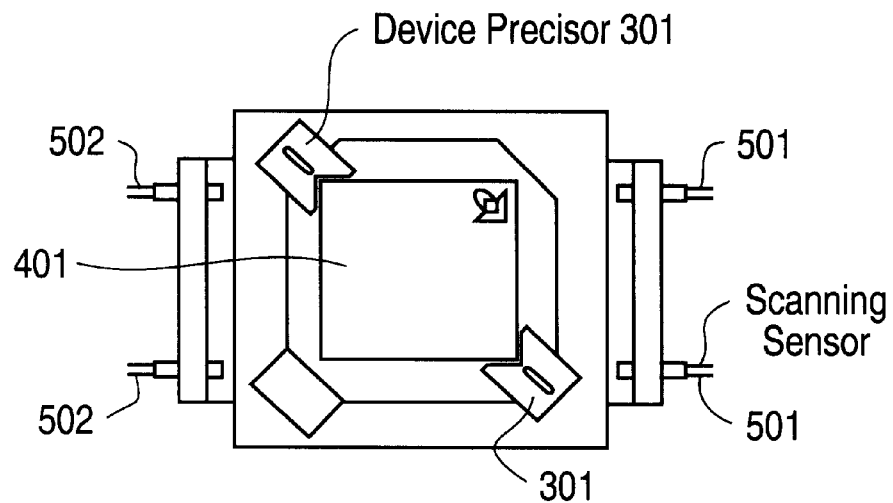
FIG. 6A is a plan view illustration of a pin grid array inspection device according to the present invention after the pin grid array has been elevated by the device holder in the inspection method of the present invention.
Figure 6B:
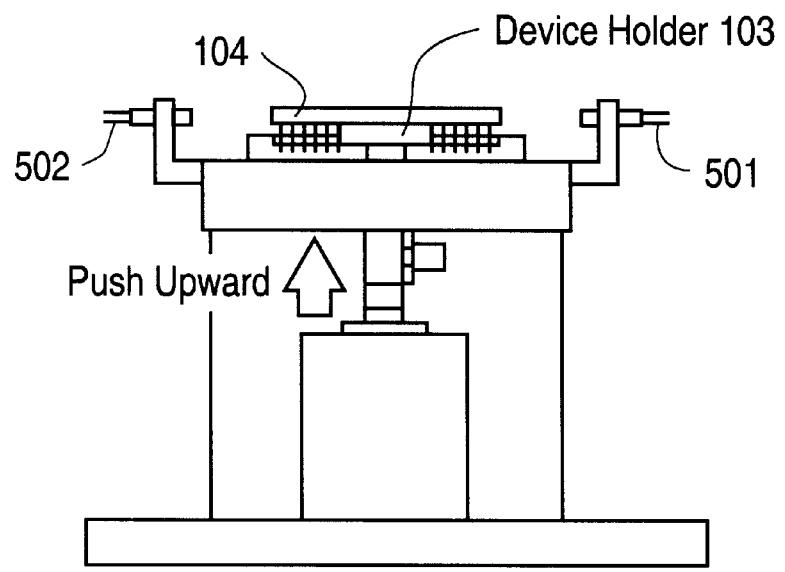
FIG. 6B is a front view illustration of a pin grid array inspection device according to the present invention after the pin grid array has been elevated by the device holder in the inspection method of the present invention.

FIG. 6A illustrates the pin grid array 104 after the optical scanning of the pin grid array for bent leads has completed. In the preferred embodiment, the tested pin grid array is raised from its central leadless portion by extending the device holder so as to insure that the pin grid is clear of the inspection gauge, and is horizontal for removal from the pin grid array inspection device according to the present invention. The pin grid array will be safely elevated from the inspection gauge even if it has one or more bent leads and therefore did not sit flatly on the inspection gauge. FIG. 6B illustrates a front view of the pin grid array 104 as it rests supported by the device holder 103 at its central leadless portion. None of the leads of the pin grid array are in contact with the inspection gauge 101 when the pin grid array is removed. The device holder may be built as a pneumatic or liquid piston extension mechanism, as electric motor driving a gear and teethed rack to implement an extending arm, or otherwise.

Figure 7:
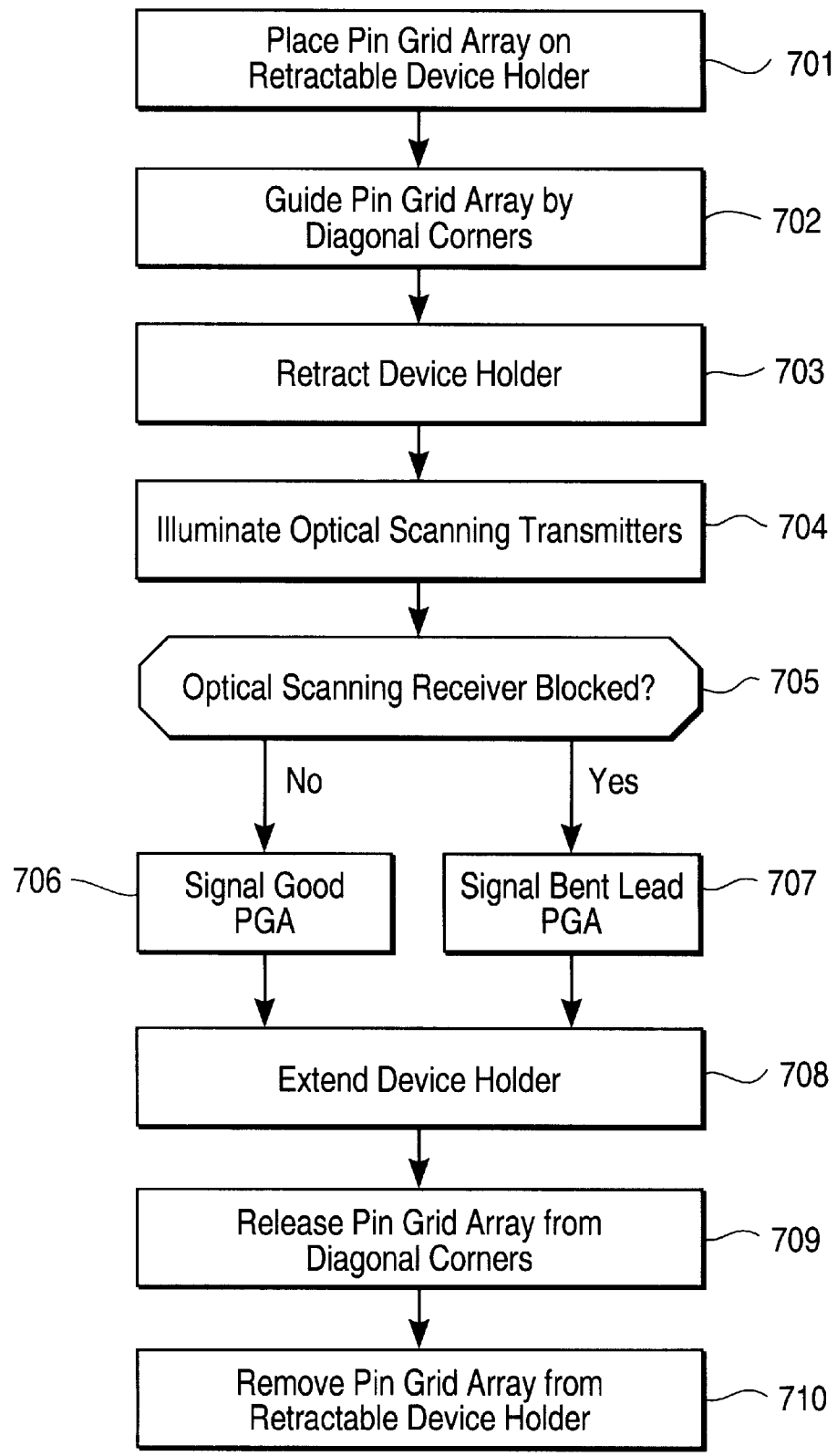

FIG. 7 illustrates a method of inspecting a pin grid array 104 for bent leads according to the present invention. At step 701, a pin grid array 104 and the inspection device (illustrated in FIG. 1A) appear as illustrated in FIGS. 1B, 2A, and 2B. At step 702, a pair of diagonal precisors 301 are automatically actuated to align the pin grid array 104 to the inspection gauge 101 as illustrated in FIG. 3A. In the preferred embodiment at step 703, the retractable device holder 103 is retracted so that the pin grid array 104 falls by the force of gravity into the inspection gauge as illustrated in FIG. 4B.

Figure 5B:
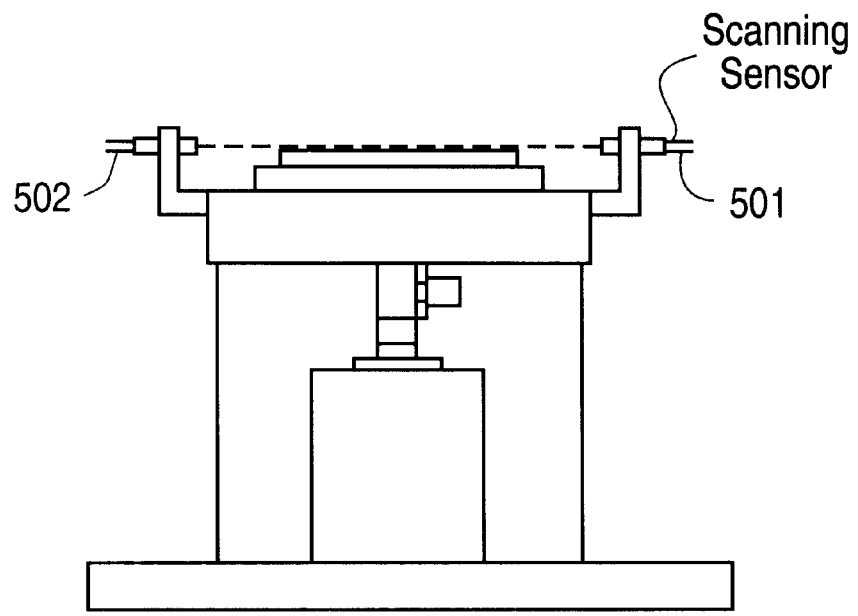
FIG. 5B is a front view illustration of a pin grid array inspection device according to the present invention during checking for a raised package or flatly resting package by optically scanning above the package in the inspection method of the present invention.

At step 704, the optical scanning transmitters 502 are illuminated as illustrated in FIG. 5A and 5B. There is no explicit requirement that the optical scanning transmitters 502 ever be turned off according to the present invention. So long as the receivers 501 are sampled at the proper after the device has been lowered, the transmitters 502 may be illuminated throughout the method of testing according to the present invention. In the preferred embodiment, the transmitters 502 are only turned on during the portion of the testing method in which the pin grid array is lowered into the inspection gauge 101. This results in slightly less power consumption. At step 705, an output circuit polls the optical inspection receivers 501. If any of the optical inspection beams are not received by their corresponding optical inspection receivers 501, then the output circuit signals the automated operator that the pin grid array 104 has a bent lead at step 707. If all the optical inspection beams are received, then the output circuit signals the automated operator that the pin grid array 104 does not have a bent lead at step 706.

The output circuit (not shown) may signal the automated operator by two lights, one indicating bent lead while the other indicates no bent lead. Alternatively, a buzzer may sound when a bent lead device is detected. If the automated operator is a machine, the output circuit may simply provide an electrical control signal to the machine indicating whether or not the pin grid array was detected to have a bent lead.

At step 708, the device holder 708 is extended so as to elevated the pin grid array from the inspection gauge as illustrated in FIGS. 6A and 6B. At step 709, an automated operated removes the pin grid array 104 from the device holder 103.

Although the present invention has been described with reference to its presently preferred embodiment, that embodiment is presented by way of example, not by way of limitation. Accordingly, those skilled in the art will be enabled by this disclosure to add to or modify the embodiments described herein in various ways obvious to those skilled in the art. These additions and modifications are deemed to lie within the spirit and scope of the present invention as set out in the appended claims.

What is claimed is:

1. A pin grid array inspection device comprising:

an inspection gauge having a rectangular matrix of holes corresponding to leads of a pin grid array;

an alignment means positioned above the inspection gauge operable to grip and release the pin grid array;

a first optical scanning transmitter mounted outside a perimeter of the inspection gauge and vertically above the inspection gauge for transmitting a first optical inspection beam;

a first optical scanning sensor mounted outside the perimeter of the inspection gauge, vertically above the inspection gauge, and opposite the first optical scanning transmitter, so as to receive the first optical inspection beam;

wherein the inspection gauge includes a central opening, the pin grid array inspection device further comprising a retractable device holder positioned in a central opening in the inspection gauge, such that the retractable device holder is above the inspection gauge when the retractable device holder is not retracted and is below the inspection gauge when the retractable device holder is retracted.

2. A pin grid array inspection device comprising:

an inspection gauge having a rectangular matrix of holes corresponding to leads of a pin grid array;

an alignment means positioned above the inspection gauge operable to grid and release the pin grid array;

a first optical scanning transmitter mounted outside a perimeter of the inspection gauge and vertically above the inspection gauge for transmitting a first optical inspection beam; and a first optical scanning sensor mounted outside the perimeter of the inspection gauge, vertically above the inspection gauge, and opposite the first optical scanning transmitter, so as to receive the first optical inspection beam;

wherein the alignment means comprises a pair of precisors positioned at diagonally opposite corners of the inspection gauge.

3. A pin grid array inspection device as in claim 2, wherein the pair of precisors are mounted on a pneumatic gripper for actuating gripping and releasing of the pin grid array.

4. A method of inspecting a pin grid array for bent leads, comprising the steps of:

lowering the pin grid array into an inspection gauge having a rectangular matrix of holes corresponding to the leads of the pin grid array;

checking whether the pin grid array falls completely into the inspection gauge such that the pin grid array rests flatly against the inspection gauge; and gripping the pin grid array by its diagonal corners using an alignment means so as to align the pin grid array to the inspection gauge, prior to the lowering step;

wherein the gripping step is performed by closing a pair of precisors onto diagonally opposite corners of the pin grid array.

5. A method as in claim 4, wherein the lowering step comprises the step of:

releasing the pin grid array so that the pin grid array falls into the inspection gauge due to gravity.

6. A method of inspecting a pin grid array for bent leads, comprising the steps of:

lowering the pin grid array into an inspection gauge having a rectangular matrix of holes corresponding to the leads of the pin grid array;

checking whether the pin grid array falls completely into the inspection gauge such that the pin grid array rests flatly against the inspection gauge;

gripping the pin grid array by its diagonal corners using an alignment means so as to align the pin grid array to the inspection gauge, prior to the lowering step; and placing the pin grid array on a retractable device holder above the inspection gauge which extends through a central opening in the inspection gauge, prior to the gripping step.

7. A method as in claim 6, wherein the lowering step comprises the step of:

retracting the retractable device holder below the inspection gauge.

8. A method of inspecting a pin grid array for bent leads, comprising the steps of:

placing the pin grid array on a retractable device holder above an inspection gauge which extends through a central opening in the inspection gauge;

guiding the pin grid array by its diagonal corners by closing a pair of precisors onto diagonally opposite corners of the pin grid array so as to align the pin grid array to the inspection gauge;

retracting the retractable device holder so that the pin grid array falls into the inspection gauge due to gravity;

shining a first optical inspection beam over a first portion of the pin grid array from a first optical inspection transmitter to a first optical inspection sensor, such that the first optical inspection beam will be blocked from reaching the first optical inspection sensor by the first portion of the pin grid array if the first portion of the pin grid array is elevated from the inspection gauge, and such that the first optical inspection beam will be received by the first optical inspection sensor if the first portion of the pin grid array lies against the inspection gauge;

shining a second optical inspection beam over a second portion of the pin grid array from a second optical inspection transmitter to a second optical inspection sensor, such that the second optical inspection beam will be blocked from reaching the second optical inspection sensor by the second portion of the pin grid array if the second portion of the pin grid array is elevated from the inspection gauge, and such that the second optical inspection beam will be received by the second optical inspection sensor if the second portion of the pin grid array lies against the inspection gauge; and signaling a bent lead if either the first optical inspection sensor does not receive the first optical inspection beam or the second optical inspection sensor does not receive the second optical inspection beam during the checking step.

* * * * *